(12) United States Patent
Haeffele

(10) Patent No.: US 7,545,848 B2
(45) Date of Patent: Jun. 9, 2009

(54) HIGH RESOLUTION TIME STAMPS FOR PERIODIC SAMPLES

(75) Inventor: Jeffrey John Haeffele, Monument, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 618 days.

(21) Appl. No.: 11/270,422

(22) Filed: Nov. 9, 2005

(65) Prior Publication Data

US 2007/0104303 A1    May 10, 2007

(51) Int. Cl.
*H04B 1/00*    (2006.01)

(52) U.S. Cl. .................. 375/145; 375/360; 713/500

(58) Field of Classification Search ............. 375/140, 375/360, 145; 713/500
See application file for complete search history.

(56) References Cited

U.S. PATENT DOCUMENTS

| 5,349,612 | A | * | 9/1994 | Guo et al. ............... 375/371 |
| 5,394,106 | A | * | 2/1995 | Black et al. .............. 327/107 |
| 5,734,876 | A |   | 3/1998 | Kowert |
| 6,075,833 | A | * | 6/2000 | Leshay et al. ............. 377/16 |
| 6,401,148 | B1 | * | 6/2002 | Camilleri ................. 710/57 |
| 2003/0158706 | A1 |   | 8/2003 | Eidson |
| 2004/0001014 | A1 | * | 1/2004 | Oberai et al. ............. 341/98 |
| 2004/0113822 | A1 | * | 6/2004 | Jiang ..................... 341/98 |
| 2004/0120361 | A1 | * | 6/2004 | Yu et al. ................ 370/545 |
| 2004/0207547 | A1 | * | 10/2004 | Jiang ..................... 341/98 |
| 2006/0158229 | A1 | * | 7/2006 | Hsu et al. ................ 327/20 |

FOREIGN PATENT DOCUMENTS

JP    2001014056 A    1/2001

* cited by examiner

*Primary Examiner*—Juan A Torres
(74) *Attorney, Agent, or Firm*—June L. Bouscaren

(57) ABSTRACT

A method and apparatus for collecting digital sample data from a target system accesses the digital sample data at transitions of a sample clock, acquires information related to an instantaneous average period of the sample clock, and records the digital sample data and the information related to the instantaneous average period of the sample clock.

34 Claims, 9 Drawing Sheets

HIGH RESOLUTION TIME STAMPS FOR PERIODIC SAMPLES

BACKGROUND

As part of traditional test of digital systems, logic and protocol analyzers collect synchronous digital data from a target system in order to test and verify proper system operation. The analyzers typically store samples from the target system using a sample clock source derived from a clock that drives the target system or a source encoded as part of the target system data stream. The analyzer provides time stamping with each stored sample in order to time correlate each stored sample. In one conventional system, the time stamp is an absolute count based upon a high frequency time clock that is stored with each sample taken. The timing resolution of the time stamp is limited by the frequency of the time clock and the amount of memory available to store the time stamp. As can be appreciated, the higher the clock frequency, the better the timing resolution, and the more memory required to store the necessary information.

In another traditional system that makes more efficient use of system memory, a store qualification sampling method stores only samples that meet some user defined criteria. The time stamp is based upon the sample clock and reflects a count of the number of states that are not stored. The time clock calculates an average period of the sample clock to a desired resolution. Based upon the assumption that the calculated average period of the sample clock is constant over time, the timing between stored samples can be calculated from the number of sample clock transitions that occur between stored samples.

As clock frequencies increase, the electronics that they run are more prone to radiate and it is more difficult to pass electromagnetic interference ("EMI") specifications. To mitigate EMI and to remain compliant with the EMI requirements, some digital systems use spread spectrum clocking ("SSC"). SSC modulates the clock frequency just enough to spread the radiation power spectrum over a wider frequency band to reduce the power amplitude at any one frequency. A typical modulation is 0-0.5% at a 30 kHz rate. Therefore, for some digital systems, the sample clock period against which a time gap may be calculated is not constant and the timing calculation that uses an overall average of the sample clock period as in the traditional system includes an error term. When accumulated over a range of samples, the error term can be significant when compared to the resolution of the time clock. Accordingly, the traditional sample clock count accumulation method of measuring the time gap between samples and calculating the time gap against an average measured sample clock period yields unacceptably erroneous measurements.

There is a need, therefore, for an improved method and apparatus for collecting digital data for a target system that uses spread spectrum clocking.

BRIEF DESCRIPTION OF THE DRAWINGS

An understanding of the present teachings can be gained from the following detailed description, taken in conjunction with the accompanying drawings of which.

DETAILED DESCRIPTION

Figure 1:
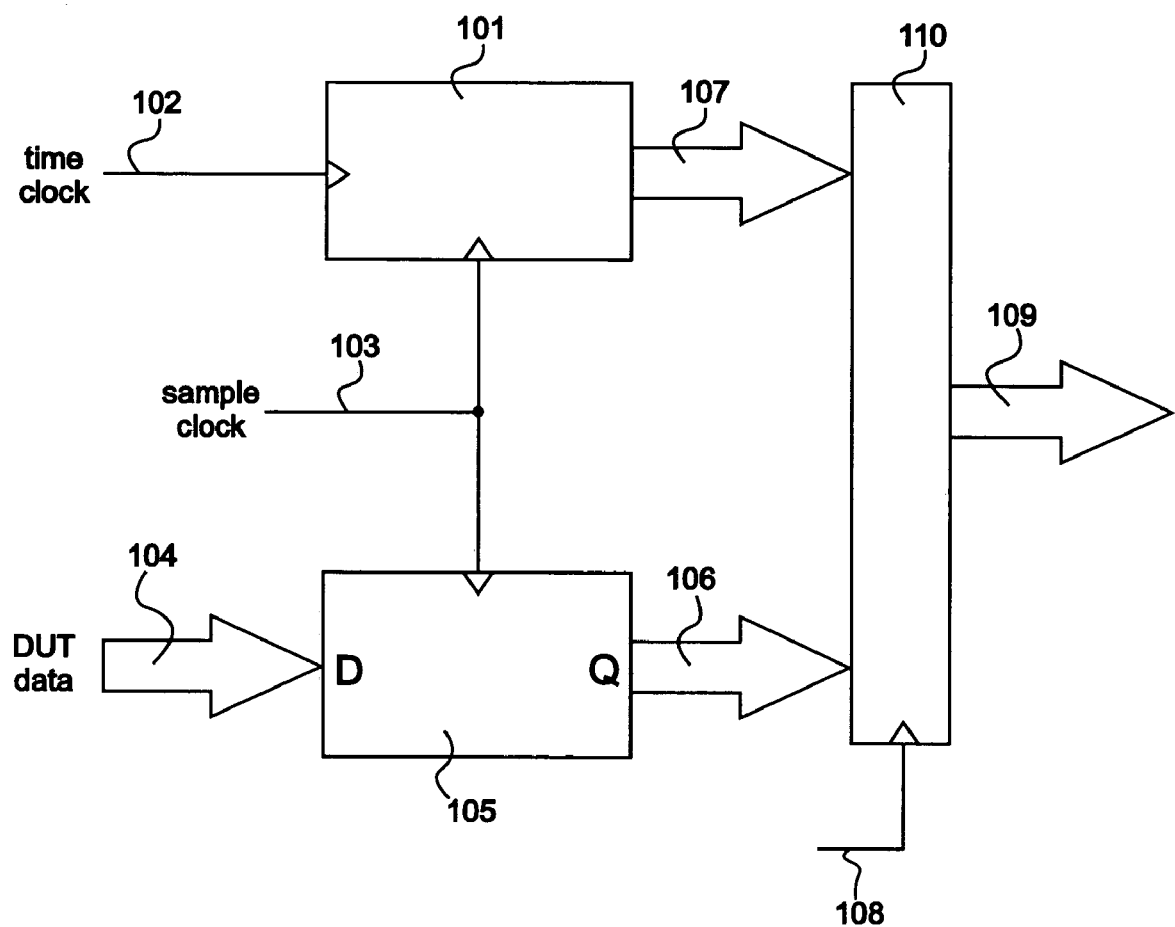
FIG. 1 is a block diagram showing a relationship of an embodiment according to the present teachings between a time clock, a sample clock, a time tag generator and digital sample data from a target system.

With specific reference to FIG. 1 of the drawings, there is shown a block diagram of a time tag generator 101 and a digital sample data register 105. A time clock 102 and a sample clock 103 drive different portions of the time tag generator 101. The sample clock 103 is derived directly from a target system (not shown) that supplies target data 104 to be measured by an embodiment according to the present teachings. Therefore, digital data collected by an embodiment according to the present teachings is synchronous with operations in the target system. The time clock 102 is a high frequency clock independent of the target system that defines a timing resolution for measurements made of the sample clock 103. The sample clock 103 also drives the digital sample data register 105 for storage of the target data 104 at transitions of the sample clock 103 to generate digital sample data 106. At selected transitions of the sample clock 103, a store signal 108 registers a time tag 107 and the current digital sample data 106 and associates the two in a data record 109.

Figure 2:
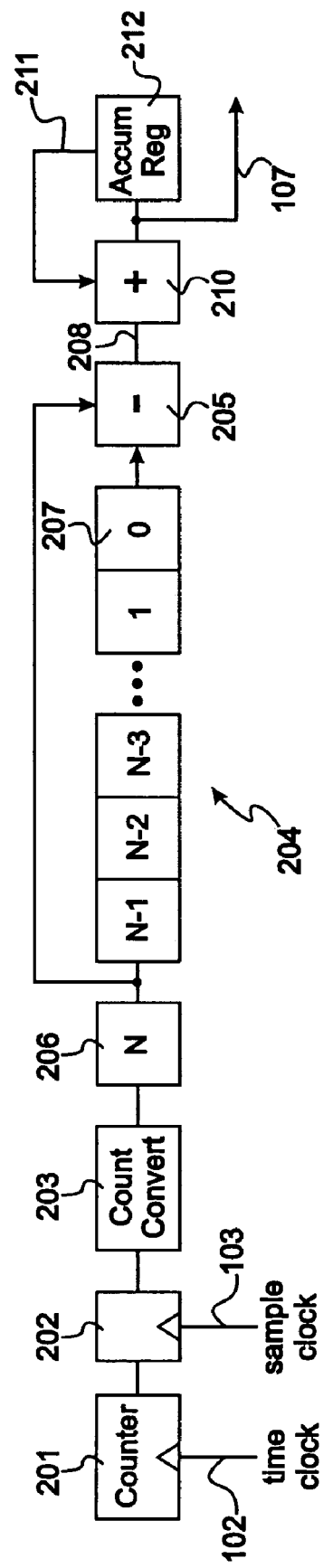
FIG. 2 is a block diagram of an embodiment of a time tag generator according to the present teachings.

With specific reference to FIG. 2 of the drawings, there is shown an embodiment of the time tag generator 101 according to the present teachings in which the time tag 107 is generated as the digital sample data 106 is registered. The time tag 107 generated in the embodiment illustrated in FIG. 2 is an absolute time stamp. The time clock 102 drives grey code counter 201. The grey code counter 201 increments at each transition of the time clock 102 so that only one bit changes at any one time. A counter register 202 records the value of the grey code counter 201 at each transition of the sample clock 103. The time clock 102 has a higher frequency than the sample clock 103 and defines a timing resolution for the measurement system. A grey to binary converter 203 converts the recorded grey code value to a binary code. After conversion, the binary counter value is stored into a first in first out (herein "FIFO") memory buffer 204 as time clock count values. Subsequent time clock count values are also stored into the FIFO buffer 204 with each transition of the sample clock 103. As is conventional with FIFO buffers, after N counter values are stored, the N+1 binary counter value is stored in the FIFO buffer 204 as a more recently stored value 206 and the less recently stored value 207 in the FIFO buffer 204 is discarded so that only the N most recently stored time clock count values are retained. A sample window time span, therefore, is defined by N multiplied by the instantaneous average period of the sample clock 103. The instantaneous average period of the sample clock 103 may be calculated based upon the number of transitions of the time clock counted over the N transitions of the sample clock 103. Accordingly, the instantaneous average sample period over the sample window time span may be calculated in a specific embodiment as the less recently stored time clock count value 207 subtracted from the more recently stored time clock count value 206 multiplied by the period of the time clock 102 divided by the number of time counts maintained in the FIFO buffer 204. The equation may be represented as:

$$T_{sample} = (COUNT_N - COUNT_0) * \left(\frac{T_{tclk}}{N}\right)$$

A difference element 205 accepts the more recently stored binary counter value 206 and subtracts its value from a less recently stored binary counter value 207 to obtain a time difference counter value 208. In a specific embodiment the more recently stored binary counter value 206 is a newest stored time clock count value and the less recently stored binary counter value 207 is the oldest stored time clock count value. In one embodiment, digital sample data is stored with each transition of the sample clock 103 and the time tag associated with the digital sample data is the calculated time difference value 208. Because each transition of the sample clock 103 records time information, it is possible to recreate all of the timing information based upon the series of sample clock time count values. Accordingly, an embodiment according to the present teachings but not shown in the drawings calculates the time tag as the time difference counter value only and the embodiment does not include elements 210-212. The illustrated embodiment of FIG. 2 of the drawings calculates an absolute time stamp as the time tag 107. In the embodiment of FIG. 2, the digital sample data 106 may be stored only at selected transitions of the sample clock 103 and not at every transition of the sample clock 103. In the illustrated embodiment of FIG. 2, of the drawings, an accumulator 210 adds each time difference counter value 208 to a previously accumulated time difference 211 stored in accumulator 212 to generate a free running absolute time stamp, which is presented as the time tag 107 in an embodiment according to the present teachings.

Figure 3:
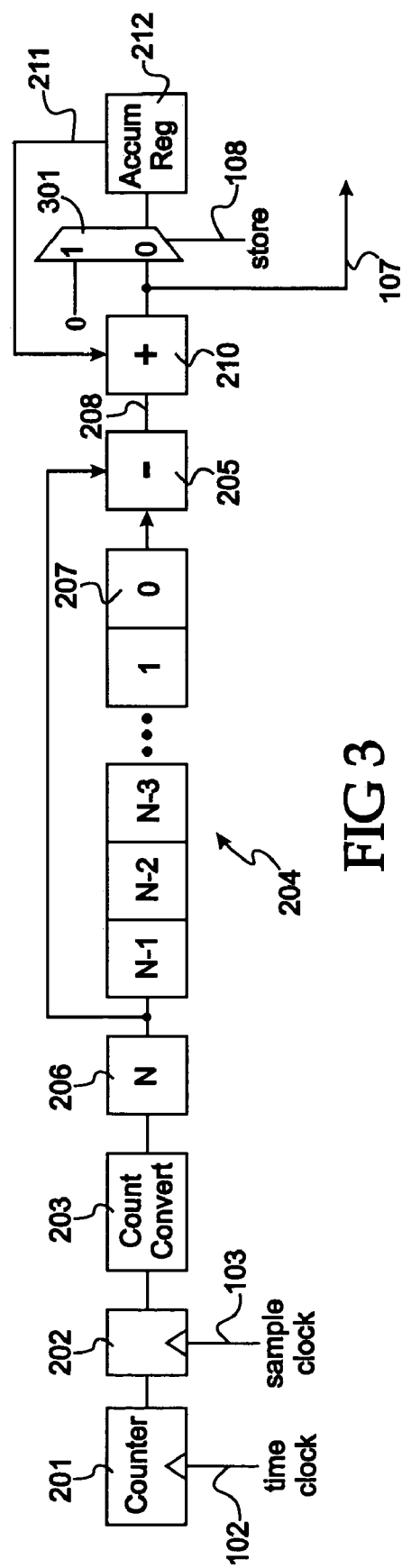
FIG. 3 is a block diagram of an alternate embodiment of a time tag generator according to present teachings.

With specific reference to FIG. 3 of the drawings, there is shown an alternate embodiment of the time tag generator 101 according to the present teachings in which the generated time tag 107 comprises a delta accumulated time stamp and maybe used in a system that records data for each sample clock transition or at only selected transitions of the sample clock. Specifically, the time tag 107 that is stored with the data represents the difference in time between storage of a currently stored current digital sample data and storage of a last stored digital sample data 106. The time difference 208 is presented to accumulator multiplexer 301. If store signal 108 is a logic true, the time tag 107 is stored as part of the digital sample data 106. The multiplexer 301 responds to store signal 108 to reset the delta time value by presenting a zero to accumulating register 212 instead of the accumulated delta time. If the store signal 108 is a logic false, the time difference 208 is added to the previously accumulated time difference 211 and is maintained in the accumulator register 212. Advantageously, the delta time stamp preserves the accuracy and resolution of the time tag 107 while requiring fewer bits for storage of timing information. The absolute time information for the digital sample data storage events may be further calculated when in the context of the other digital sample data 106 and prior to presentation of the collected data.

Figure 4:
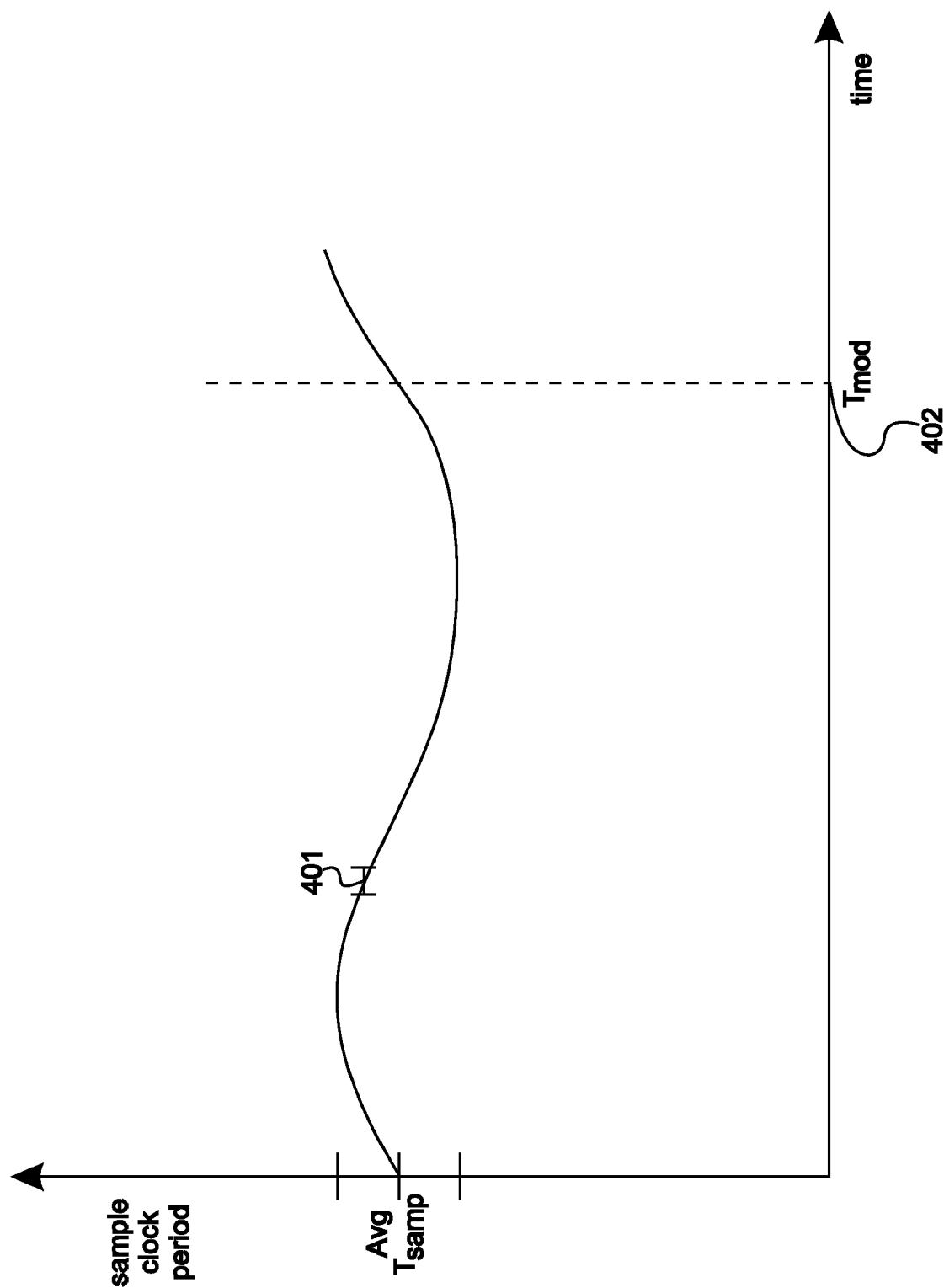
FIG. 4 is a timing diagram showing an example relationship between a period of a modulated sample clock and a sample window time span.

Target systems that use spread spectrum clocking are particularly well suited to time tags 107 according to the present teachings. Because the sample clock 103 is modulated, the period of the sample clock 103 ($T_{sample}$) changes over time and changes relatively slowly when compared to the frequency of both the time clock 102 and the sample clock 103. The time clock 102 has a constant period and may be used to measure the modulated period of the sample clock 103. As an illustrative example, a 1 GHz sample clock using spread spectrum clocking may be modulated 0.5% at 30 kHz. With specific reference to FIG. 4 of the drawings, there is shown a graph illustrating the relationship of the sample period over time relative to the period of modulation 402. The sample window time span 401 is the time over which an instantaneous average sample period is measured. The sample window time span 401 is selected to be sufficiently long to obtain meaningful time resolution of the sample period and sufficiently short relative to the sample clock modulation period 402 to cover a span of time where the instantaneous average period of the sample clock does not change significantly. As one of ordinary skill in the art appreciates, the instantaneous average period of the sample clock and N define the sample window time span 401 over which the instantaneous average of the sample period may be measured. A minimum bit width of the counter 201 is defined by the frequency of the time clock ($f_{tclk}$) 102, the minimum measurable frequency of the sample clock 103 and the depth of the FIFO (N) 204. A function for the minimum required number of counter bits ($B_{count\_min}$) may be represented as:

$$B_{count\_min} \geq \frac{\log\left(\frac{Nf_{tclk}}{f_{sample\_min}}\right)}{\log(2)}$$

The maximum bit width of the time tag 107 ($B_{timetag\_max}$) is a function of the time clock frequency ($f_{tclk}$), the depth of the FIFO 204 (N) and the maximum permitted time to represent ($t_{max}$). A function for the minimum required number of time tag bits ($B_{timetag\_min}$) may be represented as:

$$B_{timetag\_min} \geq \frac{\log(Nf_{tclk}t_{max})}{\log(2)}$$

Figure 5:
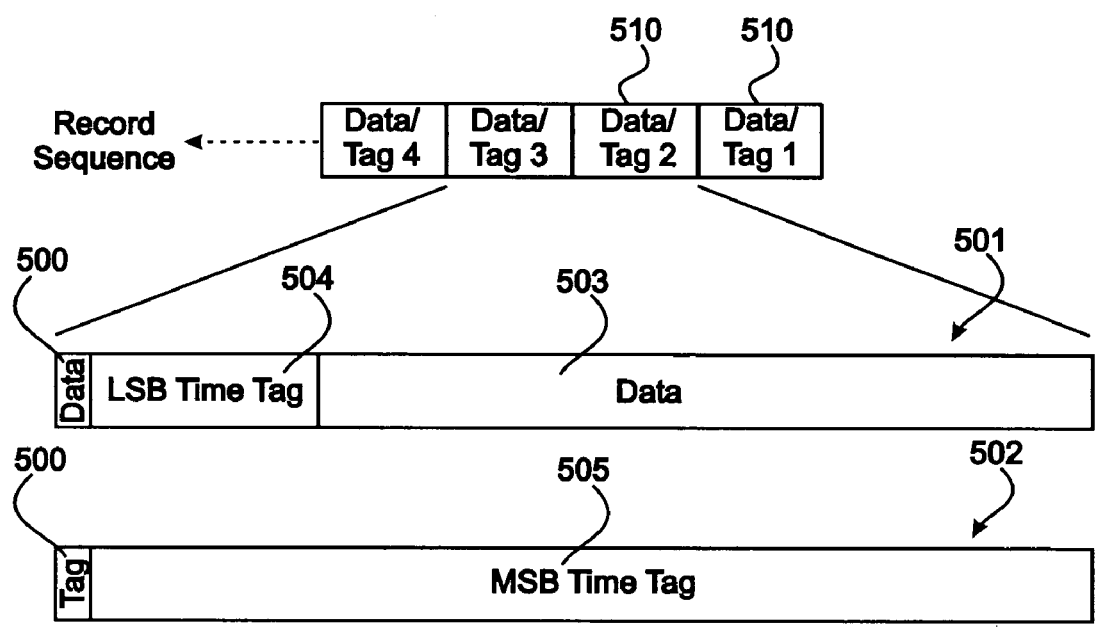
FIG. 5 is a conceptual representation of data stored in an embodiment according to the present teachings.

With specific reference to FIG. 5 of the drawings, there is shown a representation of a storage format of the digital sample data 503 and corresponding time tag 504. In a specific embodiment, when digital sample data is recorded, it is recorded as a plurality of data and tag records 510. When data is recorded by the recording device 110, it is recorded as either a single data record 501 or as a pair of data and tag records 501, 502. Specifically, digital sample data 106 recorded at sequential transitions of the sample clock 103 uses only the data record 501. Using store qualification, if one or more sample clock transitions pass between digital sample data recording events, both data and tag records 501, 502 are recorded in order to re-create all of the timing information associated with the recording event.

In both the data and tag records 501, 502, a status bit 500 indicates a record format and specifically whether the record is a data record or a tag record. The data record 501 format includes data 503 and a first time tag 504. The first time tag 504 in a specific embodiment is the 10 least significant bits of the time tag 107 and represents the number of time clock transitions over N sample clock transitions. If only the data record 501 is recorded, the 10 least significant bits of the time tag 107 fully characterize the timing since the last sample clock transition. From the information in the single data record 501, it is possible to calculate an instantaneous average sample period. If only the data record 501 is recorded, it is reasonable to assume that the sample clock period is equal to the instantaneous average sample period and because the previous sample clock transition was also stored, all necessary timing information for the data record 501 is captured.

When one or more sample clock transitions occur between digital sample data recording event, both data and tag records 501, 502 are required to capture all of the timing information. The data record 501 has the same form and content and the tag record 502 includes the most significant bits 505 of the time tag 107. The most significant bits 505 of the time tag 107 from the tag record 502 may be combined with the least significant bits 504 of the time tag 107 from the data record 501 to reconstruct the complete time tag 107. The entire time tag 107 may represent the accumulated delta time consistent with the embodiment of FIG. 3 of the drawings or the accumulated absolute time consistent with the embodiment of FIG. 2 of the drawings. In the specific embodiment where a delta time is calculated at every transition of the sample clock 103, the system is designed so there are enough bits in the data record 501 to fully represent the longer sample clock period for the time clock 102 frequency used and the tag record 502 is not needed.

Figure 6:
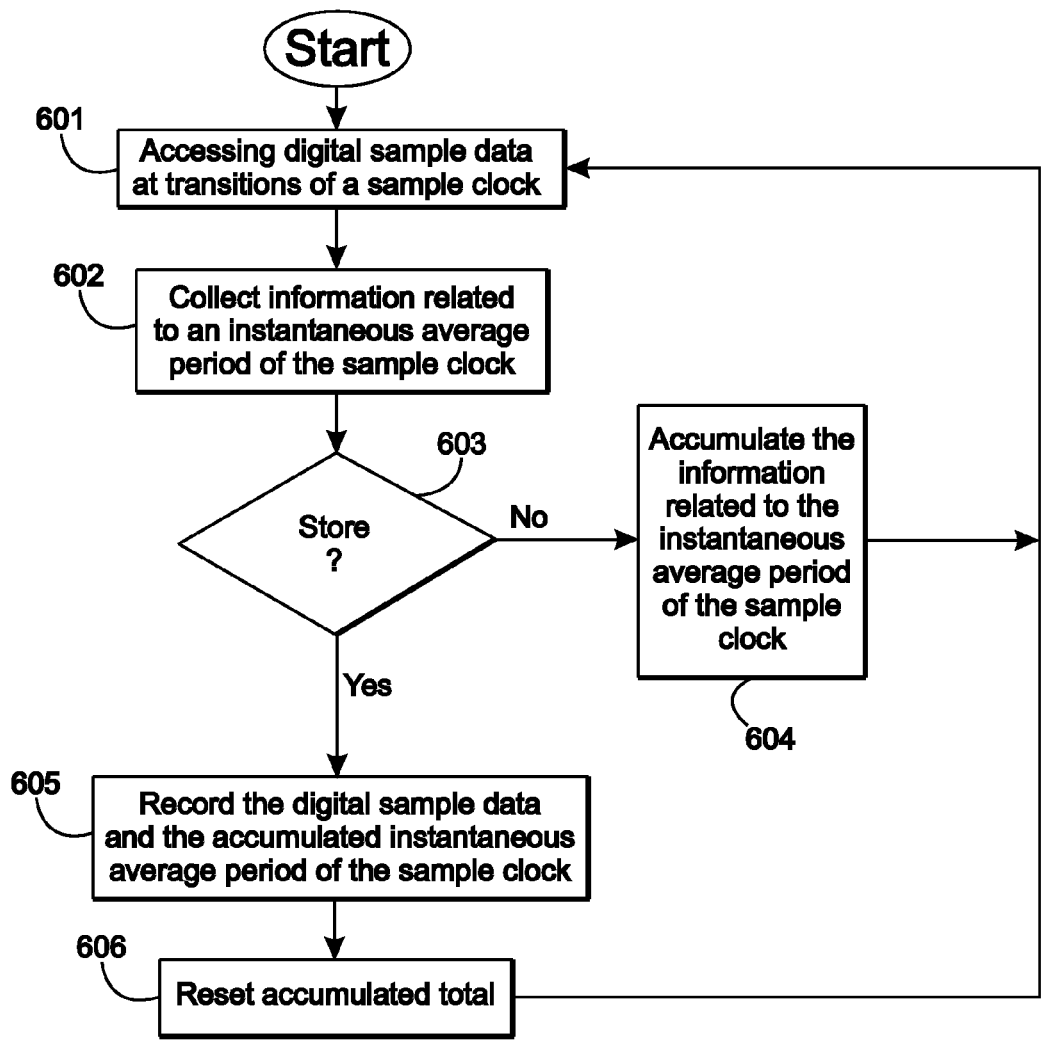
FIG. 6 is a flow chart of an embodiment according to the present teachings.

With specific reference to FIG. 6 of the drawings, there is shown a flow chart of a specific embodiment of a process according to the present teachings for collecting digital sample data from a target system in which digital sample data is accessed 601 at transitions of the sample clock 103. The process flow shown in FIG. 6 of the drawings is consistent with the specific apparatus illustrated in FIG. 3 of the drawings. A process flow for other embodiments illustrated or described are within the capability of one of ordinary skill in the art with benefit of the present teachings. Information related to the instantaneous average period of the sample clock 103 is collected 602 by determining a number of time clock transitions over N transitions of the sample clock 103. The instantaneous average period of the sample clock 103 can be calculated from the known period of the time clock 102 and the known number of sample clock transitions. If 603 the system indicates that the digital sample data 106 is to be recorded, the output of the accumulator 210 is recorded 605 as the time tag 107 together with the digital sample data 106. The accumulated total is then reset 606. If 603 the system does not indicate that the digital sample data 106 is to be recorded, the process repetitively accumulates 604 the number of time clock transitions over the N most recent transitions of the sample clock 103 until the next digital sample data is recorded.

Figure 7:
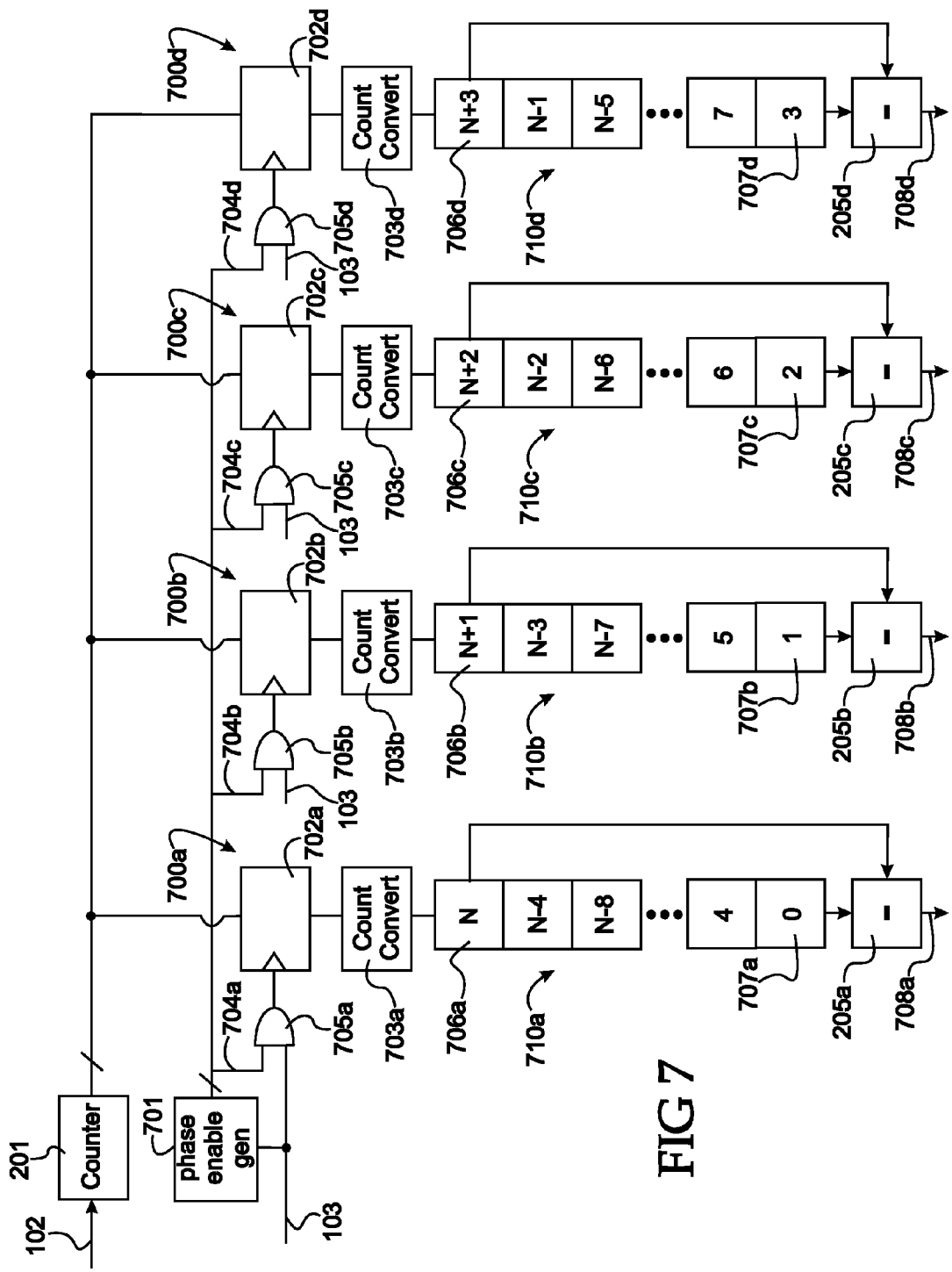
FIG. 7 is a first portion of an embodiment according to the present teachings decelerated by a factor of M, where M=4.

With specific reference to FIG. 7 of the drawings, there is shown a first portion of an alternate embodiment according to the present teachings in which the collection of counts is decelerated by a factor of M, where M=4 in the illustration. One of ordinary skill in the art is able to scale the deceleration to factors more or less than 4 with benefit of the present teachings. The grey code counter 201 accepts the time clock 102 as in the non-decelerated embodiments of FIGS. 2 and 3 of the drawings. The output of the grey code counter 201 is fed to each of first, second, third and fourth deceleration phases 700a, 700b, 700c, 700d. Each deceleration phase 700a-700d responds to one of four different phase enable signals 704a, 704b, 704c, 704d generated by phase enable generator 701. Completion of all deceleration phases is an end of a deceleration cycle and a beginning of a next deceleration cycle. Each phase enable signal 704 has a period of $$\frac{1}{M}$$

of the sample clock 103. As one of ordinary skill in the art appreciates, an embodiment having a deceleration factor of 4 generates a phase enable signal 704 having a period of one fourth of the sample clock 103. Each phase enable signal 704a is a logic true for one fourth, or more generally $$\frac{1}{M},$$

of the phase enable signal period and each phase enable signal is a logic true at a different time than the other phase enable signals 704b, 704c, 704d. Accordingly, each phase enable signal 704a-704d enables operation of each deceleration phase sequentially and repetitively. Each deceleration phase 700a-700d comprises a respective count register 702a-702d that is driven by a conjunctive combination 705a-705d of a respective one of the phase enable signals 704a-704d and the sample clock 103. Accordingly, each count register 702a-702d accepts and stores the output of the counter 201 at every fourth transition of the sample clock 103 in a deceleration by four embodiment and every $M^{th}$ transition of the sample clock 103 in a deceleration by M embodiment. The grey code count is converted at 703a-703d to its binary equivalent at each deceleration phase 700 and stored into respective FIFO buffers 710a-710d. Each FIFO buffer 710a-710d accepts every fourth or $M^{th}$ count for a total of N counts. If N count samples are taken to determine the instantaneous average sample clock period and the deceleration factor is M, then the first deceleration element accepts every $M^{th}$ count between count 0 707a-707d and count N 706a-706d for a total of $$\frac{N}{M}$$

counts. The second deceleration phase 700b accepts every $4^{th}$ count between the $1^{st}$ and N+1th counts. All subsequent deceleration elements accept every $4^{th}$ count with a first count of the deceleration phase 700b for example being subsequent to the last count stored in the previous deceleration phase 700a for example. More generally, for a deceleration factor of M taking an instantaneous average over N transitions of the sample clock 103, each deceleration element 700a-700d accepts every $M^{th}$ count for a total of $$\frac{N}{M}$$

counts. The least recently stored count 707a-707d in each deceleration phase 700a-700d is then subtracted from the respective most recently stored count 706a-706d to generate respective first through fourth time difference counter values 708a, 708b, 708c, 708d for each deceleration phase 700a, 700b, 700c, 700d.

Figure 8:
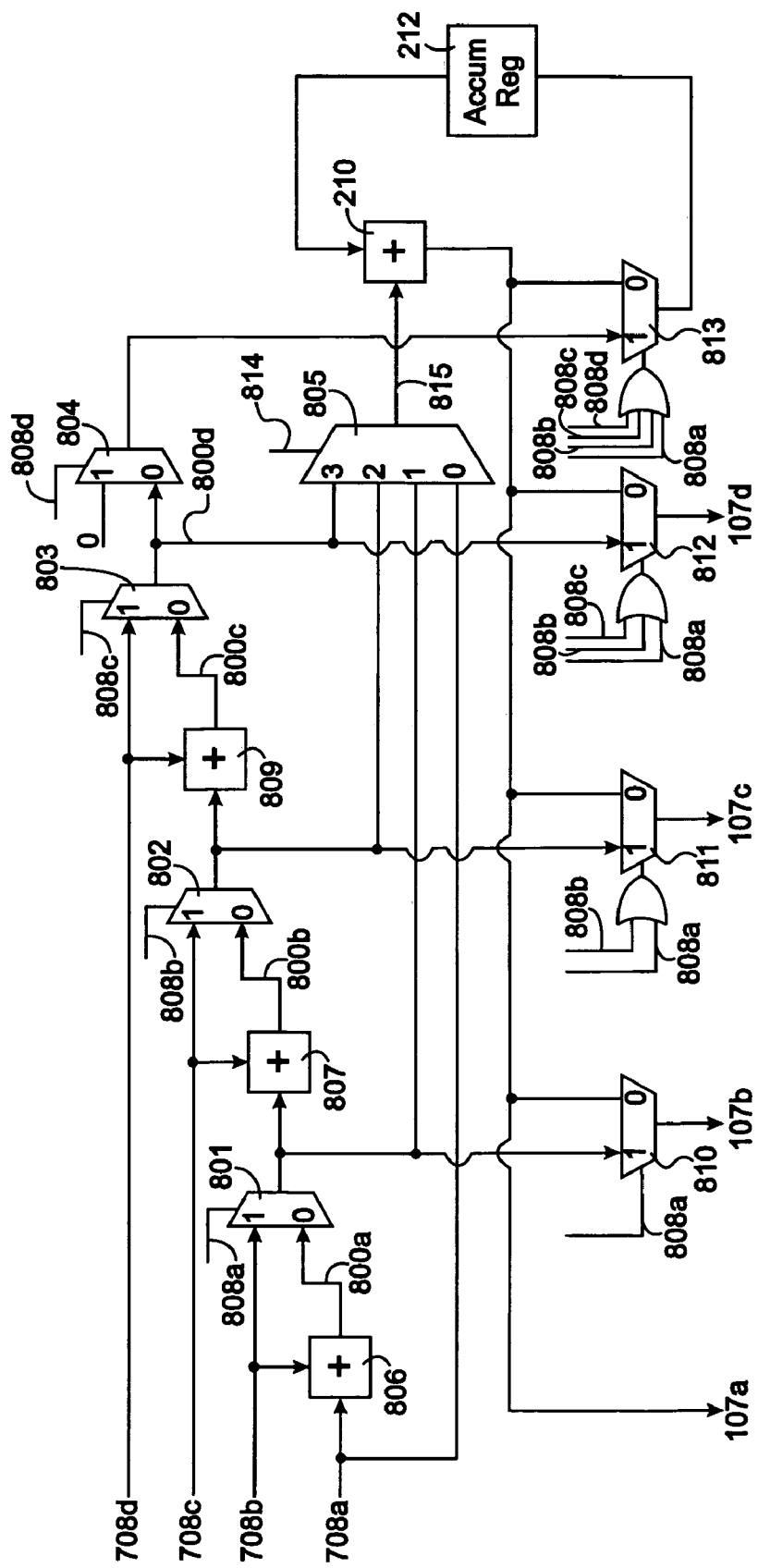
FIG. 8 is a second portion of an embodiment according to the present teachings decelerated by M.

With specific reference to FIG. 8 of the drawings there is shown a second portion of the alternate embodiment according to the present teachings decelerated by a factor of four in which the first and second time difference counter values 708a, 708b are added at first intermediate accumulator 806. In the embodiment of FIG. 8, a delta time count is maintained consistent with the undecelerated embodiment of FIG. 3 of the drawings. In the decelerated embodiment, the store signal 108 is also decelerated by the same deceleration factor M, or four in the embodiment illustrated in FIGS. 7 & 8 of the drawings. First through fourth intermediate accumulated time count totals 800a, 800b, 800c, 800d are kept within the deceleration cycle and used as time tags 107a through 107d as appropriate. Selection of the intermediate time clock count totals is determined by first, second, third and fourth store signals 808a, 808b, 808c, 808d. A logic true on one of the store signals 808a through 808d indicates that the current digital sample data 106 is recorded. The store signals 808a through 808d, therefore, also indicate an appropriate accumulated time count total to be used for subsequent recording events during the same deceleration cycle. Specifically, if any the digital sample data 106 is stored after one or more of the deceleration phases, in a system where delta time counts are maintained, the appropriate time tag 107 is one of the intermediate count totals 800a through 800d. If the digital sample data 106 is not stored during any of the phases in the deceleration cycle, the fourth intermediate accumulated total 800d is added to the contents of the accumulator register 212 in preparation for the next deceleration cycle. The accumulator register 212 is updated at the end of each deceleration cycle. The accumulators 806, 807, 809, 810, 210 and the multiplexers 801, 802, 803, 804, 805, 810, 811, 812, 813, however, perform their functions asynchronously.

An output of the first intermediate accumulator 806 and the second time difference counter value 708b are input into first time difference multiplexer 801. If the first store signal 808a is true, it indicates that the time tag 107a is recorded as part of the digital sample data record 501 or data/tag records 501, 502 and a new delta time count based on an unaccumulated time difference corresponding to the second deceleration phase 700b is used as the next accumulated delta time. If the first store signal 808a is false, it indicates that the time tag 107a was not stored. The first time difference multiplexer 801 performs a selection based upon the first store signal 808a. If the first time difference counter value 708a is stored as part of digital sample data 106, then the second time difference counter value 708b is presented at the output of the first time difference multiplexer 801. If the first time difference counter value 708a is not stored, then the sum of the first and second time difference counter values 708a, 708b are presented at the output of the first time difference multiplexer 801 in the event that one of the next phases indicates a recording event.

The remaining time difference counter values 708b, 708c, 708d are similarly treated. Specifically, the output of the first time difference multiplexer 801 is added to the third time difference counter value 708c in second intermediate accumulator 807. The third difference counter value 708c and the output of the first time difference multiplexer 801 are input into second time difference multiplexer 802. A second store signal 808b selects which of the two inputs into the second time difference multiplexer 802 is presented at its output. The output of the second time difference multiplexer 802 is presented at the input of second intermediate time difference multiplexer 811 along with the output of the accumulator 210. Selection of which input of the second intermediate time difference multiplexer 811 is presented at the output is based upon the disjunctive combination of the first and second store signals 808a, 808b. If the store signal 808a-808d is true for any of the previous deceleration phases, in order to implement the reset of the delta time in the middle of the deceleration phase the time tag 107 is based on an appropriate one of the intermediate accumulated totals 708a-708d or 800a-800d. Therefore, the disjunctive combination of store signals 108 for all of the previous deceleration phases in the deceleration cycle causes the intermediate accumulated totals to be presented and recorded as the time tag 107 instead of the output of the accumulator 210.

In a specific embodiment, the time difference counter values 708a-708d are added to the contents of the accumulator register 212 in the accumulator 210 as they are presented, but the accumulator register 212 is updated only at the end of each deceleration cycle. The first time difference counter value 708a and the outputs of the first, second, and third time difference multiplexers 801, 802, and 803 are presented as input to accumulator multiplexer 805. The accumulator 210 performs the addition based upon its current input values and presents its output as either the time tag for the first deceleration phase 107a or as an input into the intermediate time tag multiplexers 810-812. An earliest in time storage signal 808a through 808d for the current deceleration phase is encoded as a binary encoded earliest store signal 814 and performs selection of the inputs of the accumulator multiplexer 805 to be presented at its output as the intermediate accumulated count total 815 during the deceleration cycle. If none of the storage signals 808a through 808d are a logic true during the deceleration cycle, the $M^{th}$ intermediate accumulated time count total 800d is selected for presentation at the output of accumulator multiplexer 805. The binary encoded earliest storage signal 814 defines which of the inputs of the accumulator multiplexer 805 is presented at its output as a final intermediate accumulated count total 815. The intermediate accumulated count total 815 is presented as an input to accumulator 210 and is added with the contents of the accumulator register 212. Fourth (and last) time difference multiplexer 804 responds to the fourth store signal 808d. If the fourth store signal 808d is a logic true, the time difference count represented in the accumulator register 212 is reset to zero. If the fourth store signal 808d is a logic false, the accumulated total of the time difference counts 708a through 708d over each deceleration phase since the previous storage event is presented at the output of the fourth time difference multiplexer 804 and at the input of the fourth intermediate time difference storage multiplexer 813. If any one of the previous store signals 808a through 808d are a logic true, the output of the fourth time difference multiplexer 804 is presented as the input to accumulator register 212. If none of the previous store signals 808a through 808d are true, then the output of the accumulator 210 is presented at the input to accumulator register 212.

Figure 9:
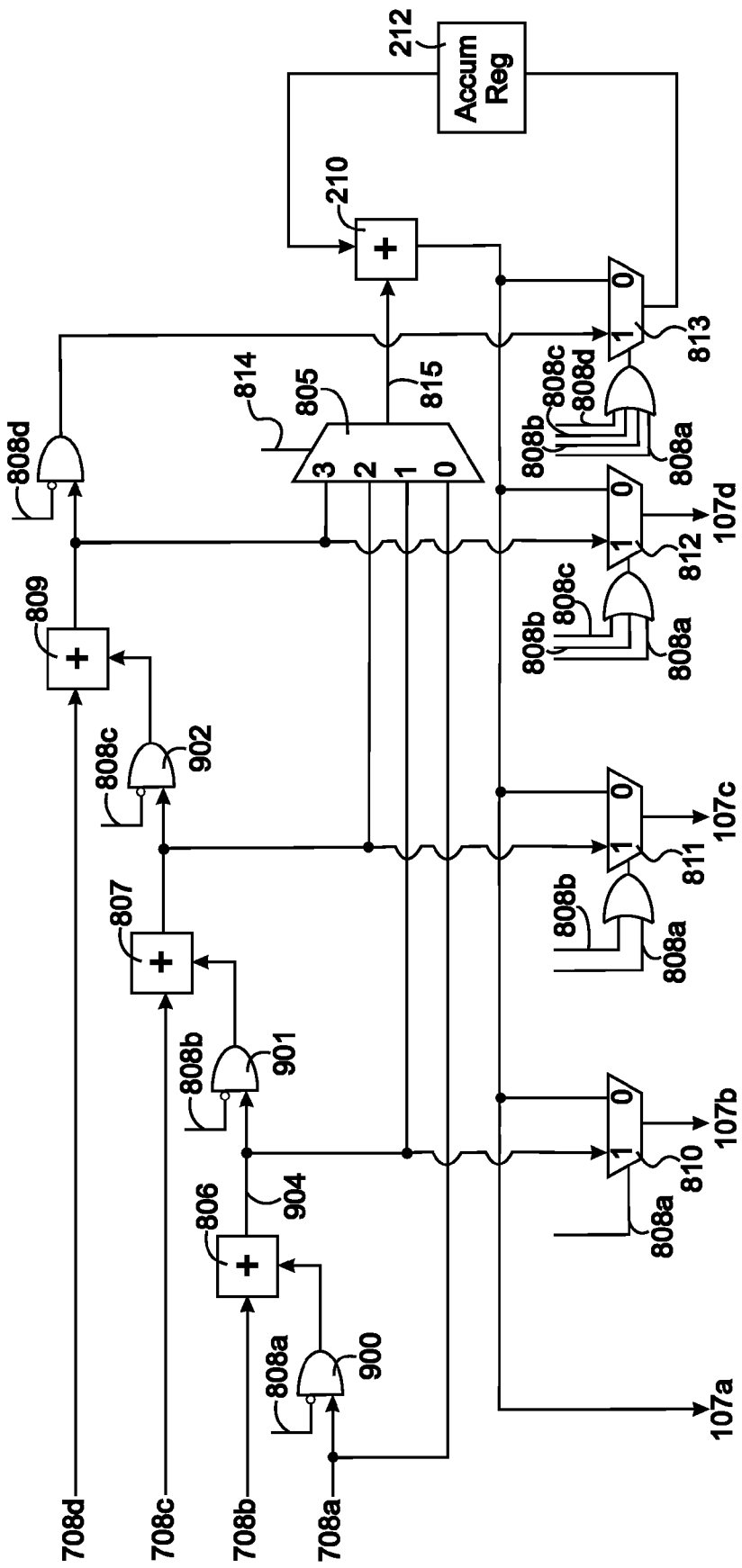
FIG. 9 is an alternate embodiment of a second portion according to the present teachings.

With specific reference to FIG. 9 of the drawings, there is shown an alternative embodiment for the second portion of the decelerated by four embodiment in which first, second, and third intermediate gates 900, 901, 902 mask or unmask inputs into intermediate accumulators 806, 807, and 809. As in the embodiment of FIG. 8 of the drawings, the output of the accumulator 210, which represents the accumulated time difference count value as of the end of the last deceleration cycle, is presented as the time tag 107a for the first deceleration phase in the event that the first recording signal 808a is a logic true. If the first recording signal 808a is a logic true, then the accumulated time difference count is reset and the time difference count value 708 for the next deceleration phase initializes the next accumulated time difference value as stored in the accumulator register 212. Each phase of the deceleration cycle is similarly implemented, so description of the first deceleration phase suffices as description for the other phases for purposes of the present disclosure. The first recording signal 808a indicates whether the last deceleration phase indicated a recording event. The intermediate accumulator 806 sums the time difference counter value 708b with the output of the first intermediate gate, which is either zero or the first time difference counter value 708a. The intermediate accumulator output 904 is presented to first intermediate time tag multiplexer 810. Also presented to the first intermediate time tag multiplexer 810 is the output of the accumulator 210. If the first recording signal 808a is a logic true, the first intermediate accumulator output 904 is presented at the output of the first intermediate time tag multiplexer 810 as the time tag 107b. If the first recording signal 808a is a logic false, the output of the accumulator 210 is presented at the output of the first intermediate time tag multiplexer 810 and properly represents the current time tag 107b. The first intermediate accumulator output 904 is also presented to the second intermediate gate 901, which masks or unmasks the first intermediate accumulator output 904 depending upon the logic value of the second recording signal 808b and presents a value to the second intermediate accumulator 807. Operation of the second intermediate accumulator 807, third intermediate gate 902 and presentation of the output of the third intermediate gate 902 to third intermediate accumulator 809 is similar to the description with respect to the first deceleration phase and for purposes of clarity is not described. Presentation of the first time difference counter value 708a and first through third intermediate accumulator outputs 904 to the accumulator multiplexer 805 is similar to the embodiment illustrated in FIG. 8 of the drawings. Accumulation of the intermediate accumulator totals and reset of the accumulator register 212 is also similar in operation to that described with respect to the embodiment shown in FIG. 8 of the drawings.

Embodiments of the teachings are described herein by way of example with reference to the accompanying drawings describing a method and apparatus for collecting digital data for a target system that uses spread spectrum clocking. Obvious variants to the present teachings such as deceleration scaling or use of dissimilar logic to perform the same functions are within the scope of the present teachings. Other variations, adaptations, and embodiments of the present teachings will occur to those of ordinary skill in the art given benefit of the present teachings.

The invention claimed is:

1. A method comprising:
accessing digital sample data at transitions of a frequency modulated sample clock,
acquiring information related to an instantaneous average period of the sample clock at each transition of the frequency modulated sample clock, and
recording the digital sample data and the acquired information, and associating the recorded digital sample data with the acquired information.

2. The method as recited in claim 1 further comprising accumulating the information related to the instantaneous average period of the frequency modulated sample clock and recording further comprises recording the digital sample data and the accumulated information.

3. The method as recited in claim 1 wherein accumulating information related to the instantaneous average period of the frequency modulated sample clock comprises determining a number of transitions of a time clock for multiple sample clock periods, the time clock having a known and consistent period over time.

4. The method as recited in claim 3 further comprising the step of accumulating the number of transitions of the time clock for each sample clock period over a plurality of most recent ones of the sample clock periods.

5. The method as recited in claim 2 further comprising the step of resetting the accumulated information related to the instantaneous average period of the sample clock after the step of recording one of the digital sample data.

6. The method as recited in claim 4 wherein the multiple sample clock periods are contiguous in time.

7. The method as recited in claim 4 wherein each sample clock period in the multiple sample clock periods are separated by a predetermined number of sample clock periods.

8. The method as recited in claim 1 wherein the step of acquiring the information related to the instantaneous average period of the sample clock comprises the steps of counting transitions of a time clock between sample clock transitions, the time clock having a higher frequency than the sample clock, maintaining time clock transition counts at transitions of the sample clock, and calculating a difference between a more recently stored time clock transition count and a less recently stored time clock transition count.

9. The method as recited in claim 8 wherein the time clock transition counts are maintained in a first in first out memory buffer and wherein the step of calculating the difference between time clock transitions comprises subtracting a first in time clock transition count from a last in time clock transition count.

10. The method as recited in claim 8 wherein the step of counting comprises counting transitions of the time clock using a grey code counter, storing the counted time clock transitions at transitions of the sample clock, and converting each stored result to its binary equivalent.

11. The method as recited in claim 1 wherein the step of acquiring is decelerated by a factor of M.

12. The method as recited in claim 11 wherein the step of acquiring further comprises collecting the information related to the instantaneous average period of the sample clock by collecting time clock transition counts for every $M^{th}$ sample clock transition in a plurality of deceleration phases.

13. The method as recited in claim 1 wherein the sample clock is modulated and a sample window time span over which the instantaneous average period of the sample clock is acquired is no more than 25% of a modulation period of the modulated sample clock.

14. A method comprising:
accessing digital sample data at transitions of a frequency modulated sample clock,
determining an instantaneous time difference between a fixed number of sample clock transitions at a transition of the sample clock, the instantaneous time difference being based upon a time clock having a fixed time clock period, and
recording the digital sample data in association with the respective time difference at the transition of the sample clock.

15. The method as recited in claim 14 further comprising the step of accumulating the instantaneous time difference and the step of recording further comprises recording the accumulated respective time difference with the respective digital sample data.

16. The method as recited in claim 15 further comprising the step of resetting the accumulated time difference to zero when the digital sample data is recorded.

17. The method as recited in claim 14 wherein the step of determining further comprises the step of counting transitions of the time clock in grey code.

18. The method as recited in claim 17 further comprising the step of convening the grey code count to a binary count.

19. The method as recited in claim 14 wherein the fixed number of sample clock transitions is selected based upon an amount of time over which the sample clock period remains substantially constant.

20. The method as recited in claim 14 wherein the step of determining further comprises the steps of storing in a FIFO buffer sequential instantaneous time clock counts for transitions of the sample clock, subtracting a previously stored time clock count from a recently stored time clock count to generate the instantaneous time difference between the fixed number of sample clock transitions.

21. The method as recited in claim 20 wherein the sequential transitions of the sample clock are contiguous in time.

22. The method as recited in claim 20 wherein the sequential transitions are every $M^{th}$ transition of the sample clock.

23. An apparatus comprising:
- a time clock and a counter counting time clock transitions,
- at least two memory elements configured in cascaded combination to store time clock count values of the counter at each transition of a frequency modulated sample clock,
- a processing element calculating a difference between most recently and least recently stored time clock count values, and
- a collection device for recording the digital sample data in association with the difference at selected transitions of the sample clock.

24. The apparatus as recited in claim 23 further comprising an accumulator accumulating the differences wherein the collection device records the accumulated difference in conjunction with the digital sample data at selected transitions of the sample clock.

25. The apparatus as recited in claim 24 further comprising a selection element for resetting the accumulated difference at selected transitions of the sample clock.

26. The apparatus as recited in claim 25 wherein the selected transitions occur when the digital sample data is recorded.

27. The apparatus as recited in claim 23 wherein the counter is a grey code counter.

28. The apparatus as recited in claim 23 wherein the memory element supplies data to a first in first out ("FIFO") memory buffer.

29. The apparatus as recited in claim 28 wherein the sample clock is modulated and the FIFO memory buffer maintains a number of the time clock count values over a time span comprising no more than 25% of a modulation period of the sample clock.

30. The apparatus as recited in claim 28 wherein the processing element calculates a difference between a less recently stored time clock count value and a more recently stored time clock count value.

31. The apparatus as recited in claim 23 having a plurality of deceleration phases wherein each deceleration phase comprises respective ones of the at least two memory elements and respective ones of the processing element calculating the difference between respective ones of the stored time clock count values.

32. The apparatus as recited in claim 31 wherein there are M deceleration phases and wherein every Mth time clock count value is stored in the memory elements.

33. The apparatus as recited in claim 31 further comprising at least one accumulator in each deceleration phase accumulating the differences.

34. The apparatus as recited in claim 33 further comprising a plurality of accumulators in each deceleration phase.

* * * * *